United States Patent [19]

Stegenga

[11] Patent Number: 4,585,122
[45] Date of Patent: Apr. 29, 1986

[54] SECURE HOUSING ARRANGEMENT FOR ELECTRONIC APPARATUS

[75] Inventor: Jerry A. Stegenga, Coral Gables, Fla.

[73] Assignee: Racal Data Communications, Inc., Miami, Fla.

[21] Appl. No.: 695,666

[22] Filed: Jan. 28, 1985

[51] Int. Cl.$^4$ .............................................. B65D 73/02
[52] U.S. Cl. .................... 206/334; 220/4 E; 220/4 F; 220/260
[58] Field of Search ................. 206/328, 334; 211/40; 220/4 E, 4 B, 4 F, 260

[56] References Cited

U.S. PATENT DOCUMENTS

| | | |
|---|---|---|
| 2,649,991 | 8/1953 | Woock . |
| 2,744,650 | 5/1956 | Woessner . |
| 2,899,097 | 8/1959 | Haskins . |
| 3,147,943 | 9/1964 | Oldenburg et al. . |
| 3,208,620 | 9/1965 | Herdering . |
| 3,687,325 | 8/1972 | Simons ................................ 220/4 F |
| 3,774,984 | 11/1973 | Banico et al. ....................... 220/4 F |
| 3,913,774 | 10/1975 | Vajtay . |
| 4,061,228 | 12/1977 | Johnson . |
| 4,089,464 | 5/1978 | Teti et al. ............................ 220/4 F |
| 4,102,557 | 7/1978 | Leg et al. ............................ 220/4 F |
| 4,163,503 | 8/1979 | McKinnon . |
| 4,210,252 | 7/1980 | Cooke et al. ........................ 220/4 F |
| 4,215,796 | 8/1980 | Johnston et al. . |
| 4,219,693 | 8/1980 | French . |
| 4,220,252 | 9/1980 | Beall et al. . |
| 4,421,246 | 12/1983 | Schultz et al. . |

Primary Examiner—Joseph Man-Fu Moy
Attorney, Agent, or Firm—Jerry A. Miller

[57] ABSTRACT

A secure housing arrangement is provided which requires tools to disassemble. Upper and lower enclosure members (12 and 14) contain latch receiving portions (50) near apertures (44) in the enclosure members. End members (26 and 28) include latching members (42) which resiliently engage with latch receiving portions (50) to form a snap together housing assembly. Disassembly of the housing may be attained by inserting a small tool (72) through small apertures (44) in the housing used to access the latching mechanism. A recessed face plate (30) on the end members (26 and 28) are surrounded by upper and lower lips (38 and 40) which extend outwardly to a point at least flush with the outermost portion of the upper and lower enclosure members. In this manner, force exerted against the upper and lower lips are substantially absorbed by the end members rather than being transmitted to upper and lower enclosure members.

13 Claims, 3 Drawing Figures

SECURE HOUSING ARRANGEMENT FOR ELECTRONIC APPARATUS

BACKGROUND OF THE INVENTION

1. Field of the Invention

This invention relates generally to the field of secure housing arrangements for enclosing electronic circuitry or the like, and more particularly this invention relates to low cost housings requiring no tools to assemble yet requiring tools to disassemble.

2. Background of the Invention

It is frequently desirable to provide an enclosure or housing for an electronic apparatus which has a degree of tamper resistance built in by requiring that a tool be used to disassemble the housing. This makes access to possibly hazardous voltages within the housing more difficult thus, enhancing the safety of the electronic device and reducing the hazard of shock or fire.

In fact, product safety organizations such as Canadian Standards Association (CSA) and Underwriter Laboratories (UL) have established standard for such enclosures. CSA Standard for Data Processing Equipment for Consumer and Commercial Products C22.2 No. 154-M1983 and UL 478 Standard for Information-Processing and Business Equipment are two such standards for so called "secure enclosures". It is advantages for both safety and business considerations to enclose electronic devices inside of housings which meet these types of specifications.

Several examples of fastening arrangements which are typically used to satisfy the requirements of such standards are ordinary screw fastener arrangements or quarter-turn coin operated fasteners. Unfortunately, there are serious cost drawbacks to utilizing either of these common fastening arrangements. In the case of screw fasteners, although the part cost is nominal the labor associated with assembling a screw assembled enclosure is considerable. In the case of quarter-turn coin operated fasteners, parts cost is relatively higher and the degree of security attained is somewhat limited due to the many types of devices (including coins) which can be used to open such fasteners. Additionally, serious damage to electronic circuits may occur if such metal fasteners are accidentally dropped or left inside such housings.

Resilient latches of various arrangements have been used for assembling various types of plastic containers in the past. However, the present invention utilizes a resilient plastic latching arrangement which allows for inexpensive ABS type plastic to be used abundantly and provides a secure enclosure of exceedingly low parts and labor costs. In addition, the recessed face plate arrangement of the present invention provides an added measure of tamper resistance.

SUMMARY OF THE INVENTION

It is an object of the present invention to provide an improved secure housing arrangement for providing secure enclosure of electronic circuitry and the like.

It is another object of the present invention to provide a housing arrangement with integral support for printed wiring boards and the like.

It is another object of the present invention to provide a low cost housing assembly for electronic devices.

It is a further object of the present invention to provide a tamper resistant enclosure for electronic circuitry.

It is an advantage of the present invention to allow low cost types of plastic to be used for the majority of a snap together enclosure.

It is another advantage of the present invention that the enclosure can be quickly assembled without tools but cannot be disassembled without use of a small tool, thereby decreasing assembly cost while discouraging tampering.

These and other objects and advantages of the invention will become apparent to those skilled in the art upon consideration of the following description of the invention.

In one embodiment of the present invention a secure housing arrangement includes upper and lower enclosure members each having an inner and an outer surface and a first end with an aperture adjacent the first end. Upper and lower latch receiving portions are coupled to each of the upper and lower enclosure members respectively with each latch receiving portion situated adjacent the inner surface near the apertures. An end member having upper and lower resilient latching portions suitable for engaging the upper and lower latch receiving portions respectively are provided in a manner which permits disengagement of the latching portion by accessing the latching portion through the aperture with a suitably small tool. The apertures are suitably dimensioned to prevent human fingers from accessing the latching portion without use of a suitably small tool. Preferably the enclosure is substantially rectangular in overall shape with latch receiving portions and latching portions situated near each corner. The end member may include a holding mechanism for captivating the circuit boards which are to be enclosed by the housing.

The features of the invention believed to be novel are set forth with particularity in the appended claims. The invention itself however, both as to organization and method of operation, together with further objects and advantages thereof, may be best understood by reference to the following description taken in conjunction with the accompanying drawings.

DETAILED DESCRIPTION OF THE PREFERRED EMBODIMENT

Figure 1:
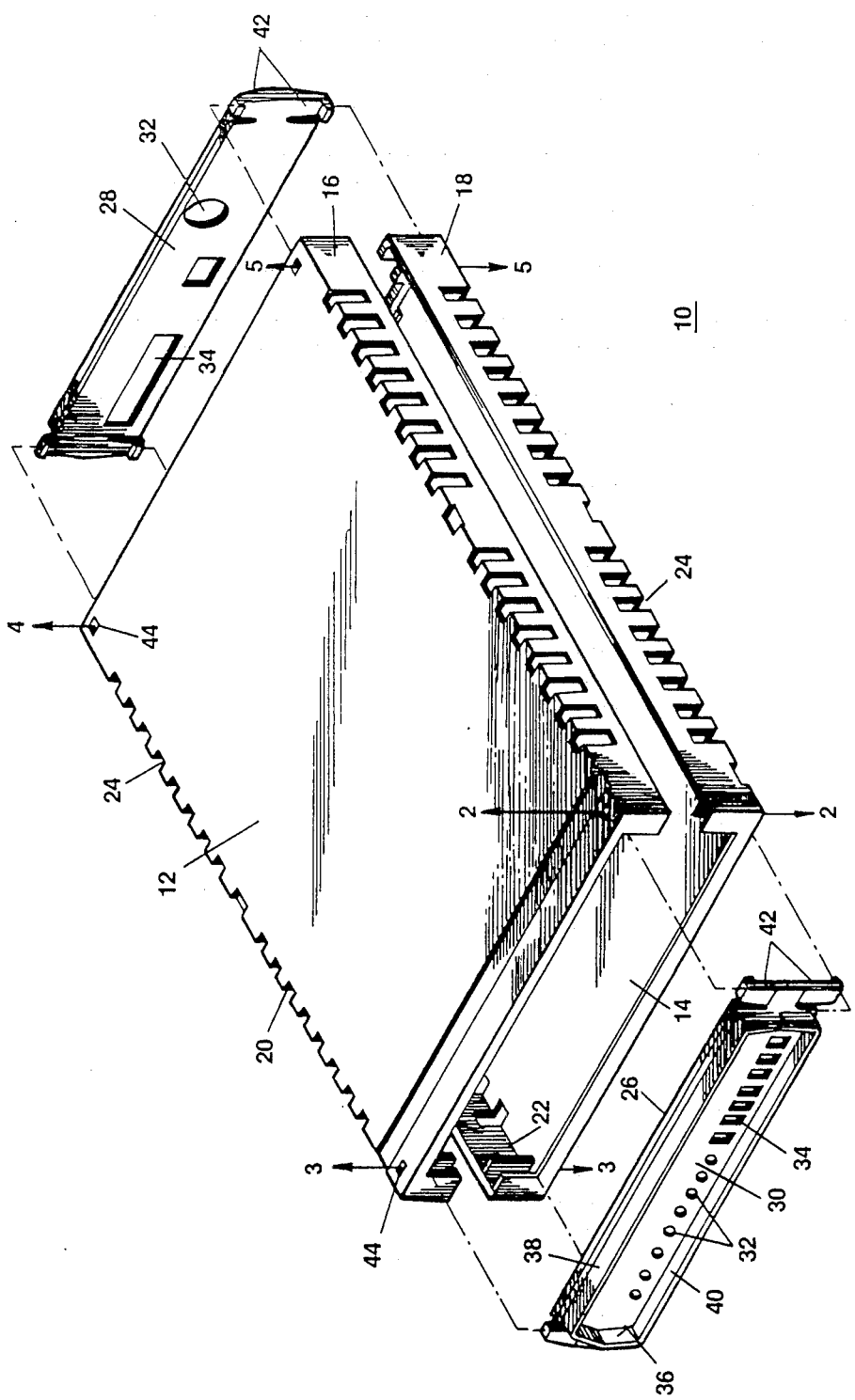
FIG. 1 is an exploded view of a secure housing arrangement according to the present invention.

Referring now to the drawings, wherein like reference numerals designate identical or corresponding parts throughout the several views, and more particularly to FIG. 1 thereof, an exploded view of the housing or enclosure according to the present invention is shown and designated generally as 10. For clarity of illustration, circuit boards or other internal structures which the housing 10 may be used to enclose are not shown in FIG. 1. Housing 10 includes an upper enclosure member 12 along with a lower enclosure member 14. Side walls of the enclosure are formed by integral half-walls 16 and 18 of enclosure members 12 and 14 respectively. Similarly half-walls 20 and 22 of enclosure members 12 and 14 form the other side wall of housing 10.

The housing 10 may also include one or more venting apertures 24 to provide for convection cooling of the enclosed electronic circuits. In a rectangular box type of housing as shown in FIG. 1, the large majority of raw material of the housing 10 is contained in the upper and lower enclosure members 12 and 14. It is therefore desirable to utilize low cost materials such as ABS plastics (for example Borg Warner KJW or Monsanto 911 brands of ABS plastics) for enclosure members 10 and 12. While cost considerations dictate that such plastics should be used for the enclosures, such materials have a number of inherent disadvantages when attempting to eliminate conventional fasteners such as screws in favor of resilient plastic snap together type assemblies. One such disadvantage is the inability to cope with high stresses which is typical of such ABS plastics.

The present invention overcomes these difficulties by utilizing first and second elongated end members 26 and 28 respectively. Other advantages are inherent in using such end members as will become apparent from the foregoing discussion.

End member 26 (and 28) preferably includes a recessed face plate 30 which may include various apertures 32 and slots 34 as may be convenient for mounting indicators, connectors, controls. Recessed face plate 30 is surrounded by a lip 36 having upper and lower portions corresponding to the upper enclosure member and the lower enclosure member. (The upper lip portion is designated 38 while the lower lip portion is designated 40). It is advantageous to utilize a recessed face plate so that controls and indicators mounted thereto are protected from damage.

Near each end of the first and second end members 26 and 28 a pair of latching members, each designated 42, is shown. These latching members mate with latch receiving portions (not shown in FIG. 1) situated on the inner surface of upper and lower enclosure members 12 and 14 adjacent each of the apertures labeled 44 when assembled as shown by assembly lines 2—2, 3—3, 4—4, and 5—5. The latching mechanism of the present invention is shown in greater detail in FIG. 2.

First and second end members 26 and 28 are each preferably made of a relatively resilient plastic such as polycarbonate similar to General Electric's Lexan (TM) 940. Since end members 26 and 28 utilize a significantly smaller amount of plastic than upper and lower enclosure members 12 and 14, it is cost effective to utilize the relative expensive polycarbonate material for end members 26 and 28. The required resilience and strength is thereby achieved for latching members 42.

Figure 2:
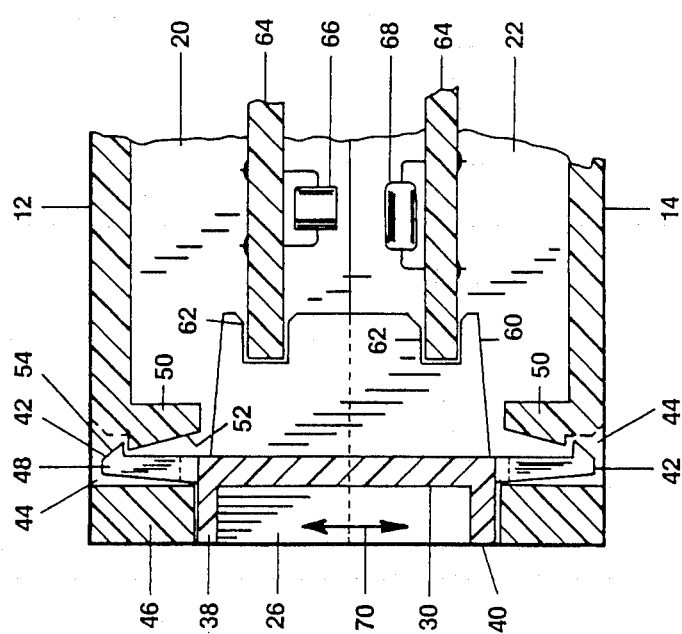
FIG. 2 shows a cross-section of a portion of the housing of FIG. 1 taken along section lines 2—2.

Turning now to FIG. 2, a cutaway portion of housing 10 is shown along section lines 2—2. In this figure, latching member 42 is seen to include a resilient support structure 46 terminating in a substantially wedge-shaped hook 48. Both latching members 42 are shown engaged with a latch receiving portion 50. In the present embodiment, latch receiving portion 50 includes a first sloping surface 52 while the wedge-shaped hook 48 of latching member 42 includes a second sloping surface 54.

During assembly sloping surfaces 52 and 54 slide against one another until the widest portions of both wedged shaped pass each other. This action causes resilient support structure 46 to bend away from latch receiving portion 50 until the widest portions of both wedge shapes pass each other. At this point the resilience of support structure 46 forces wedge-shaped hook 48 into a position above upper latch receiving portion 50 thereby completing a snap-together type engagement of the latch assembly requiring no tools for assembly. Aperture 44 is suitably dimensioned so that latching member 42 does not protrude beyond the outer surface of the upper and lower enclosure members. Aperture 44 is also suitably dimensioned so that the latch assembly cannot be disengaged manually, for example by a human finger entering the aperture. One skilled in the art will of course recognize that the various configurations of latch receiving members may be suitably implemented without digressing from the spirit of the present invention. In the preferred embodiment, aperture 44 is approximately 0.6 cm square or less, but this is not to be limiting. The small size of aperture 44 also serves to conceal the exact arrangement of the latching mechanism from view, further discouraging tampering.

Another feature of the present invention shown in FIG. 2 is that the end members can be utilized to hold or support internal circuit boards such as printed wiring boards and like assemblies. They may be accomplished by introducing a planar vartical wall 60 normal to the end members and attached to the inner surface thereof. Wall 60 may include one or more notches 62 preferably having beveled corners at the innermost points to facilitate insertion of printed wiring boards 64 and the like. These printed wiring boards 64 may contain various electronic circuit elements such as resistors, capacitors, transistors, integrated circuits and the like as illustrated by the components 66 and 68 of FIG. 2. The spacing between circuit boards when more than one is utilized may of course be adjusted by varying the distance between the notches. Similarly, the circuit boards may be placed close together and inverted in the case of printed wiring boards having components on only one surface thereof so that the components face the upper and lower enclosure members rather than one another as shown. It should be noted that walls 60 are not shown in FIG. 1 in order to enhance the clarity of that figure. It should also be noted that with large housings supporting large circuit boards it may be necessary or desirable to place structures for enhanced support of the circuit board on the inner surfaces of the upper and lower enclosure members respectively. This may be accomplished in a number of ways as will be appreciated by those skilled in the art.

Another important feature of the present invention is illustrated in FIG. 2. This feature prevents unauthorized tampering by making it difficult to exert substantial amounts separating force upon the upper and lower enclosure members. As can be seen from the sectional view of FIG. 2, upper and lower lips 38 and 40 protrude outward from recessed face plate 30 by at least as far as the forward-most portion of upper and lower enclosure members 12 and 14. Thus, one is most inclined to exert forces against upper and lower lips 38 and 40 in the direction shown by arrows 70 in an attempt to force the enclosure open. As can be readily seen however, substantially all of such forces are absorbed by end member 26 with only small amounts of such forces being actually transmitted to the upper and lower enclosure members. Only a small amount of such force resulting from flexture of lips 38 and 40 will be transmitted to the upper and lower enclosure members 12 and 14 respectively. Such a housing arrangement makes it difficult to attain significant leverage as would be necessary to break the latching mechanism and force the housing open.

Figure 3:
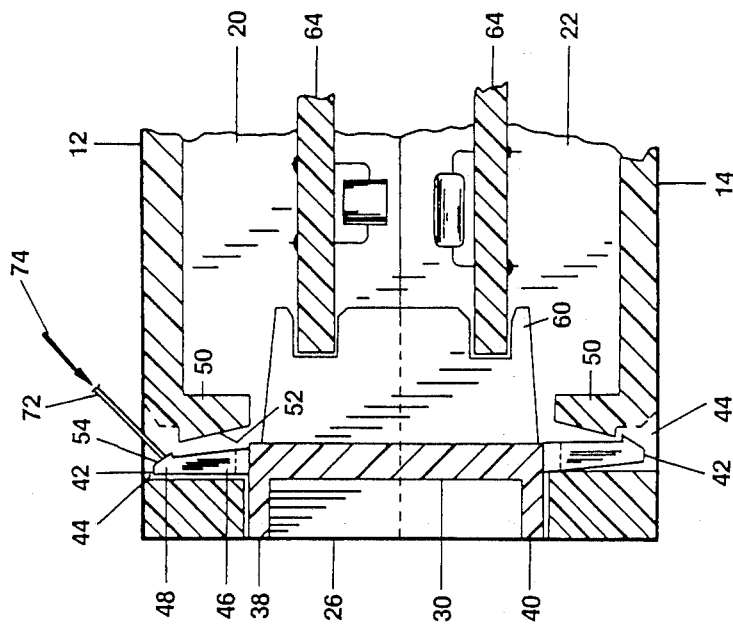
FIG. 3 illustrates the method of utilizing a small tool to disengage the latching mechanism of the present invention.

In order to open housing 10 a small tool such as a small screwdriver 72 (blade only shown) is inserted into aperture 44 and placed against second surface 54. Force may then be applied with the screwdriver or other small tool 72 in the direction of arrow 74 in FIG. 3. This flexes the resilient support structure 46 allowing the widest portion of wedge-shaped hook 48 to clear the widest portion of the wedge-like latch receiving portion 50. At this point, slight upward force on upper enclosure member 12 will completely release the latch. This process may be repeated for each of the eight latches to completely disassemble the housing. Also, only either the upper or lower enclosure member may be removed by disengaging the appropriate four latches. The present assembly and disassembly procedures can be repeated successfully many times in order to gain access to the electronics enclosed by housing 10.

Thus it is apparent that in accordance with the present invention an apparatus that fully satisfies the objectives, aims, and advantages is set forth above. While the invention has been described in conjunction with a specific embodiment, it is evident that many alternatives, modifications and variations will become apparent to those skilled in the art in light of the foregoing description. Accordingly, it is intended that the present invention embrace all such alternatives, modifications and variations as fall within the spirit and broad scope of the appended claims.

What is claimed is:

1. A secure housing arrangement, comprising:
    upper and lower enclosure members each having an inner and an outer surface, a first end and an aperture adjacent said first end;
    upper and lower latch receiving means, one coupled to each of said upper and lower enclosure members respectively, each latch receiving means situated adjacent said inner surface and adjacent said aperture;
    a first end member, having upper and lower latching means suitable for engaging said upper and lower latch receiving means respectively in a manner which permits disengagement of said latching means by accessing said latching means through said apertures with a suitably small tool; and,
    wherein each of said apertures are suitably dimensioned to discourage access to said latching means with human fingers.

2. The secure housing arrangement of claim 1, further including:
    a recessed face plate attached to said end member, said recessed face plate having upper and lower lips extending outward from said face plate;
    wherein said lips extend to at least the outer surface at said first end of said upper and lower enclosure members; and
    whereby external forces applied to said lips in effort to separate said upper and lower housing members are substantially absorbed by said end means.

3. The secure housing arrangement of claim 2, wherein:
    said end member includes holding means for holding a printed wiring board within said housing.

4. The secure housing arrangement of claim 1, further including:
    holding means coupled to said end member, for holding an assembly within said housing.

5. The secure housing arrangement of claim 4, wherein:
    said assembly includes an electronic circuit board.

6. The secure housing arrangement of claim 1, wherein:
    each of said latching means includes a resilient support holding a substantially wedge-shaped portion; and
    each of said latch receiving means includes a relatively rigid wedge receiving portion which engages and captivates said wedge-shaped portion by allowing said resilient support to force engagement of said wedge-shaped portion with said wedge receiving portion when said enclosure members and said end members are snapped together.

7. A secure housing arrangement, comprising:
    upper and lower enclosure members each having an inner and outer surface and four corners with an aperture adjacent each of said four corners;
    a plurality of latch receiving means, one situated adjacent each of said apertures and attached to one of said inner surfaces;
    end means, having a plurality of latching means suitable for engaging each of said plurality of latch receiving means in a manner which permits disengagement of said latching means by accessing said latching means through said apertures with a suitably small tool; and
    wherein each of said apertures are suitably dimensioned to discourage access to said latching means with human fingers.

8. The secure housing arrangement of claim 7, further including:
    a recessed face plate attached to said end member, said recessed face plate having upper and lower lips extending outward from said face plate;
    wherein said lips extend to at least the outer surface at said first end of said upper and lower enclosure members; and
    whereby external forces applied to said lips in effort to separate said upper and lower housing members are substantially absorbed by said end means.

9. The secure housing arrangement of claim 8, wherein:
    said end member includes holding means for holding a printed wiring board within said housing.

10. The secure housing arrangement of claim 7, further including:
    holding means coupled to said end means, for holding an assembly within said housing.

11. The secure housing arrangement of claim 10, wherein:
    said assembly includes an electronic circuit board.

12. The secure housing arrangement of claim 7, wherein:
    each of said latching means includes a resilient support holding a substantially wedge-shaped portion, and
    each of said latch receiving means includes a relatively rigid wedge receiving portion which engages and captivates said wedge shaped portion by allowing said resilient support to force engagement when said enclosure members and said end members are snapped together.

13. A secure housing arrangement, comprising:
    upper and lower enclosure members each having an inner and outer surface and four corners with an aperture adjacent each of said four corners, each of said apertures being suitably dimensioned to discourage entry of human fingers through said apertures;
first and second elongated end members, each having four resilient supports supporting four substantially wedge-shaped latching portions;
eight relatively rigid wedge receiving latch portions, one situated adjacent each of said apertures and attached to said inner surfaces, said wedge receiving latch portions arranged to receive each of said wedge-shaped latching portions when said housing is assembled;
first and second recessed face plates, each having a periphery attached to said first and second elongated end members respectively, each of said recessed face plates having upper and lower lips extending outward from said face plate about the periphery of said face plates at least as far as said outer surface of said upper and lower enclosure members; and
a pair of vertical planar walls attached to said end members and adapted to receive and support an electronic circuit board.

* * * * *